United States Patent
Lekkala et al.

(10) Patent No.: US 10,965,383 B1
(45) Date of Patent: Mar. 30, 2021

(54) ZERO HOLD TIME SAMPLER FOR LOW VOLTAGE OPERATION

(71) Applicant: QUALCOMM Incorporated, San Diego, CA (US)

(72) Inventors: Suresh Naidu Lekkala, Bangalore (IN); Sajin Mohamad, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/732,570

(22) Filed: Jan. 2, 2020

(51) Int. Cl.
*H03K 17/00* (2006.01)
*H04B 14/04* (2006.01)
*H03K 19/0185* (2006.01)

(52) U.S. Cl.
CPC ... *H04B 14/044* (2013.01); *H03K 19/018571* (2013.01)

(58) Field of Classification Search
CPC ............ H04B 14/044; H03K 19/018571
USPC ........................................ 327/51, 91
See application file for complete search history.

(56) References Cited

U.S. PATENT DOCUMENTS

| | | | | |
|---|---|---|---|---|
| 6,278,308 B1 * | 8/2001 | Partovi | ................. | H03K 3/012 327/200 |
| 6,756,823 B1 * | 6/2004 | Chen | ................ | H03K 3/356121 327/52 |
| 6,806,761 B1 * | 10/2004 | Aude | .................... | H02M 3/073 327/536 |
| 7,301,373 B1 * | 11/2007 | Bailey | ................. | H03F 3/45179 326/95 |
| 7,411,420 B2 * | 8/2008 | Doi | ................... | H03K 3/356139 326/68 |
| 7,764,102 B2 * | 7/2010 | Pacha | .............. | H03K 3/356121 327/208 |
| 9,606,177 B2 * | 3/2017 | Bailey | .............. | G01R 31/31727 |
| 2004/0027185 A1 * | 2/2004 | Fiedler | ............ | H03K 3/356139 327/211 |
| 2005/0162193 A1 * | 7/2005 | Payne | ............. | H03K 3/356173 327/52 |
| 2009/0315624 A1 * | 12/2009 | Chow | ...................... | H03F 1/34 330/291 |

OTHER PUBLICATIONS

Razavi B., "The StrongARM Latch," A Circuit for All Seasons, IEEE Solid-State Circuits Magazine, Jun. 2015, vol. 7(2), pp. 12-17.

* cited by examiner

*Primary Examiner* — Ryan Jager
(74) *Attorney, Agent, or Firm* — Patterson+Sheridan, L.L.P.

(57) ABSTRACT

Certain aspects of the present disclosure generally relate to a sampling circuit, such as a sampling circuit for a low-voltage differential signaling (LVDS) serializer/deserializer (SerDes) system. One example sampling circuit generally includes a latching circuit and a plurality of pass-gate transistors. The latching circuit includes differential inputs, differential outputs, a clocked input circuit coupled to the differential inputs, a first cross-coupled circuit coupled to the clocked input circuit, and a second cross-coupled circuit coupled to the first cross-coupled circuit, wherein the first and second cross-coupled circuits are coupled to the differential outputs of the latching circuit. Each pass-gate transistor is coupled between one of the differential inputs of the latching circuit and a corresponding differential input of the sampling circuit.

17 Claims, 2 Drawing Sheets

US 10,965,383 B1

ZERO HOLD TIME SAMPLER FOR LOW VOLTAGE OPERATION

BACKGROUND

Field of the Disclosure

Certain aspects of the present disclosure generally relate to electronic components and, more particularly, to a sampling circuit.

Description of Related Art

The use of high-speed serial communication links in electronic systems has continued to grow. In certain cases, serial interfaces may be used for inter-integrated circuit (IC) communications within an electrical device (e.g., a serial bus between a storage device and a processing system) and/or between electrical devices (e.g., serial bus between a computer and a smart watch). In other cases, the serial interfaces may be used for inter-circuit communications within a system-on-chip (SoC). High-speed serial communication links can operate according to various standards such as Universal Serial Bus (USB), High-Definition Multimedia Interface (HDMI), Serial Advanced Technology Attachment (SATA), and Peripheral Component Interconnect Express (PCIe) interfaces. A serializer/deserializer (SerDes) is used to transmit and receive data via a serial communication link. A SerDes transmitter serializes a multi-bit word into a serial data stream of corresponding bits. A SerDes receiver deserializes the received serial data stream into the original multi-bit word. In some SerDes systems, a clock signal is transmitted along with the serial data stream, whereas in other SerDes systems, the clock signal is instead embedded in the serial data stream.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved sampling of a serializer/deserializer (SerDes) receiver.

Certain aspects of the present disclosure provide a sampling circuit for a SerDes receiver. The sampling circuit generally includes a latching circuit and a plurality of pass-gate transistors. The latching circuit includes differential inputs, differential outputs, a clocked input circuit coupled to the differential inputs, a first cross-coupled circuit coupled to the clocked input circuit, and a second cross-coupled circuit coupled to the first cross-coupled circuit, wherein the first and second cross-coupled circuits are coupled to the differential outputs of the latching circuit. Each pass-gate transistor is coupled between one of the differential inputs of the latching circuit and a corresponding differential input of the sampling circuit.

Certain aspects of the present disclosure provide a serializer/deserializer (SerDes) receiver comprising the sampling circuit described herein.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to an improved sampling circuit, for example, in low-voltage (e.g., <100 mV) and high frequency (e.g., >1 GHz) applications.

Example SerDes System

Figure 1:
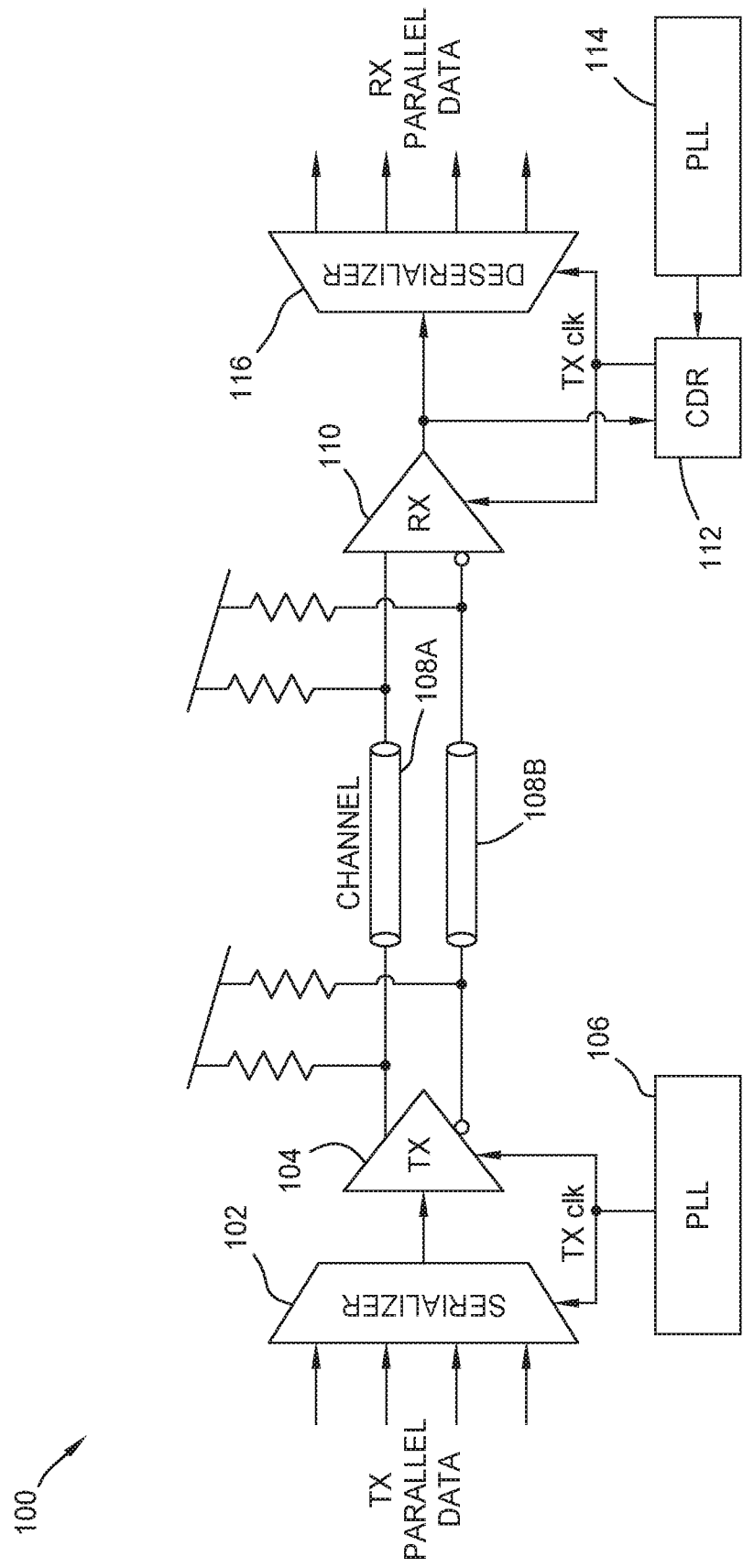
FIG. 1 illustrates a diagram of an example serializer/deserializer (SerDes) system having a SerDes transmitter and a SerDes receiver, in accordance with certain aspects of the present disclosure.

FIG. 1 illustrates an example SerDes system 100, in accordance with certain aspects of the present disclosure. As shown, the SerDes system 100 may include a serializer 102, a SerDes transmitter 104 (labeled "Tx"), a phase-locked loop (PLL) 106 for providing a transmit clock, one or more serial channels 108A-B, a SerDes receiver 110 (labeled "Rx"), a clock data recovery (CDR) circuit 112, a PLL 114, and a deserializer 116.

The serializer 102 converts data received on a parallel interface to a serial interface and provides a signal (e.g., a bitstream) of the serial data to the SerDes transmitter 104. The SerDes transmitter 104 be implemented as a driver and may amplify the serial data signal and output a differential signal on the serial channels 108A, 108B. In certain aspects, the differential signal may be a low-voltage differential signal (LVDS). In certain aspects, the serial channel 108A may carry the non-inverted signal of the differential pair, and the serial channel 108B may carry the inverted signal (i.e., the complementary signal) of the differential pair. In aspects, the differential signal output by the SerDes transmitter 104 may be sampled and generated according to the transmit clock output by the PLL 106. In aspects, PLL 106 may be used as a clock-synthesizer circuit that generates a high-speed master clock used for the serial data transmission.

The SerDes receiver 110 receives the differential signal of the serial data on the serial channels 108A, 108B and may amplify the differential signal. In aspects, the SerDes receiver 110 may perform equalization of the differential signal. The CDR circuit 112 is coupled to the output of the SerDes receiver 110 and performs the timing recovery to recover the master clock used to sample the received signals at the SerDes receiver 110. In aspects, the CDR circuit 112 may receive a reference clock signal via the PLL 114. The deserializer 116 converts the serial signal output by the SerDes receiver 110 to parallel form.

Certain sampling circuits in a SerDes receiver may have a hold time that is proportional to the response time. Given this characteristic, the hold time of the sampling circuits may limit the low voltage operation (e.g., <100 mV) as the sampling circuit response time increases with the low voltage supply, for example, due to jitter on the differential signal components. That is, in low voltage applications (e.g., <100 mV), the response time of certain sampling circuits may increase as the supply voltage decreases, and, given the proportional relationship between the response time and hold time, the hold time of certain sampling circuits may increase, as well. Thus, in certain cases, the hold time of certain sampling circuits may increase as the supply voltage decreases, which may limit the frequency operation of the sampling circuits.

While the examples provided herein are described with respect to differential serial channels to facilitate understanding, aspects of the present disclosure may also be applied to single-ended serial channels.

Certain aspects of the present disclosure provide a sampling circuit that is capable of operating at high frequencies (e.g., >1 GHz) and low voltages (e.g., <100 mV). In aspects, the sampling circuit may have a reduced hold time and reduced operating voltage. As such, the sampling circuit described herein may improve the performance of a SerDes receiver by reducing the power consumption of the SerDes receiver and facilitating higher data rates of operation.

Example Sampling Circuit

Figure 2:
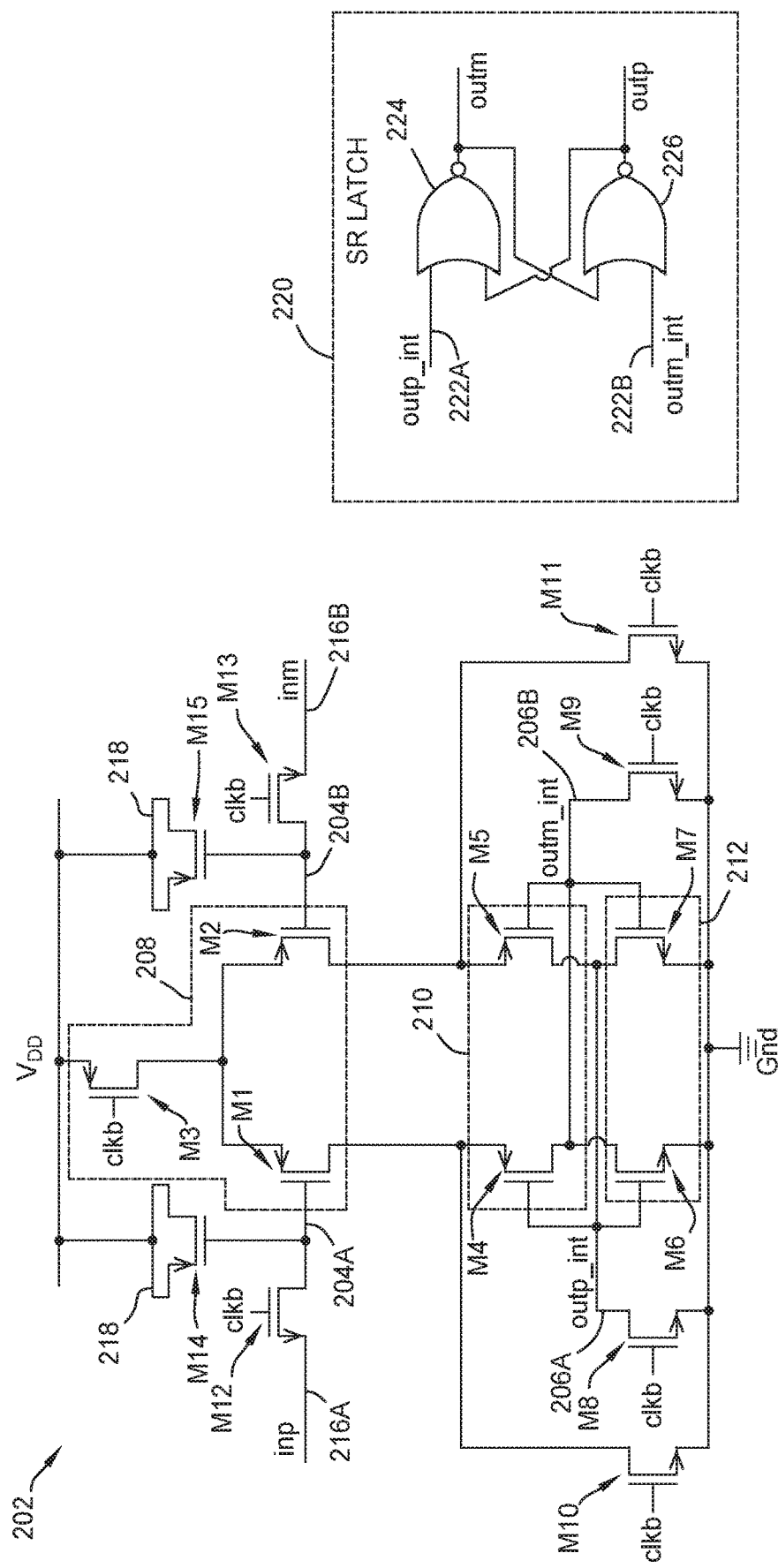
FIG. 2 illustrates a sampling circuit for the SerDes receiver of FIG. 1, in accordance with certain aspects of the present disclosure.

FIG. 2 illustrates an example differential sampling circuit 200 for a SerDes receiver (e.g., the SerDes receiver 110 of FIG. 1), in accordance with certain aspects of the present disclosure. As shown, the sampling circuit 200 includes a latching circuit 202 and a plurality of pass-gate transistors M12, M13. In aspects, the sampling circuit 200 is a low-voltage (e.g., <100 mV) differential signaling (LVDS) sampling circuit. In certain aspects, the SerDes receiver 110 of FIG. 1 may include the sampling circuit 200 of FIG. 2.

In certain aspects, the latching circuit 202 may include or be implemented as a StrongARM latch. For example, the latching circuit 202 may have differential inputs 204A, 204B (inp, inm), differential outputs 206A, 206B (outp_int, outm_int), a clocked input circuit 208 (e.g., transistors M1, M2, M3) coupled to the differential inputs (204A, 204B), a first cross-coupled circuit 210 (e.g., transistors M4, M5) coupled to the clocked input circuit 208, and a second cross-coupled circuit 212 (e.g., transistors M6, M7) coupled to the first cross-coupled circuit 210, where the first and second cross-coupled circuits 210, 212 are coupled to the differential outputs 206A, 2016B of the latching circuit 202.

In aspects, each of the pass-gate transistors M12, M13 is coupled between one of the differential inputs 204A, 204B of the latching circuit 202 and a corresponding differential input 216A, 216B of the sampling circuit 200. In certain aspects, at least one of the plurality of pass-gate transistors M12, M13 may include a n-type metal-oxide-semiconductor (NMOS) transistor having a source coupled to one of the differential inputs 204A, 204B of the latching circuit 202 and a drain coupled to the corresponding differential input 216A, 216B of the sampling circuit 200.

In aspects, the sampling circuit 200 may further include a voltage rail (VDD) configured to supply current to the sampling circuit 200. In aspects, the sampling circuit 200 may further include a reference potential node (Gnd).

In aspects, the sampling circuit 200 may further include a plurality of capacitive elements 218 (e.g., implemented by transistors M14, M15), where each capacitive element may be coupled between one of the differential inputs 204A, 204B of the latching circuit 202 and the voltage rail VDD. In certain aspects, the capacitive elements may include a metal-insulator-metal (MIM) capacitor, metal-oxide-metal (MOM) capacitor, a metal-oxide-semiconductor (MOS) capacitor, a metal fringe capacitor, a trench capacitor, a junction capacitance of a diode or transistor, or the like. In aspects, at least one of the plurality of capacitive elements may include a transistor (M14 and/or M15) having a gate coupled to one of the differential inputs of the latching circuit, a drain, and a source coupled to the drain and to the voltage rail VDD. In aspects, the transistor M14, M15 may include a p-type metal-oxide-semiconductor (PMOS) transistor.

In aspects, the sampling circuit 200 may further include a clock signal node (clkb). In aspects, the clocked input circuit 208 may include a first transistor M1, a second transistor M2, and a third transistor M3. The first transistor M1 has a gate coupled to a first input of the latching circuit, and the second transistor M2 has a gate coupled to a second input of the latching circuit, where the first and second inputs are the differential inputs 204A, 204B of the latching circuit 202. The third transistor M3 has a source coupled to the voltage rail VDD, a drain coupled to sources of the first and second transistors M1, M2, and a gate coupled to the clock signal node clkb. In aspects, the first, second, and third transistors M1, M2, M3 are PMOS transistors.

In aspects, as the pass-gate transistors M12, M13 include a different type of transistor (e.g., NMOS) compared to the transistors (e.g., PMOS) of the clocked input circuit 208, the pass-gate transistors M12, M13 are able to pre-charge (or discharge) the differential inputs 204A, 204B of the latching circuit 202 to a certain voltage (such as the voltage at the capacitive elements 218) before the differential input signal is sampled by the clocked input circuit 208. For example, when the clock signal node goes high, the clocked input circuit 208 is switched off, and the pass-gate transistors M12, M13 are switched on, which allows the capacitive elements 218 to charge to the voltage of the differential signal. When the clock signal node goes low, the clocked input circuit 208 is switched on, and the pass-gate transistors M12, M13 are switched off, which allows the capacitive elements 218 (and/or the capacitance of the pass-gate transistors M12, M13) to locally and quickly supply the gates of the transistors M1 and M2 with the pre-charge voltage. In certain cases, the pre-charge/discharge of the differential inputs 204A, 204B may be enabled by the capacitance of the pass-gate transistors M12, M13 (e.g., the source-drain capacitance ($G_{ds}$) and/or gate-drain capacitance ($C_{gd}$)).

The pre-charge/discharge of the differential inputs 204A, 204B may enable the sampling circuit 200 to decrease the hold time and operate at faster frequencies at low voltages. In some cases, the pre-charge of the differential inputs 204A, 204B may facilitate an enhanced hold time that is independent of the voltage level of the supply voltage (VDD).

In aspects, the first cross-coupled circuit 210 may include a fourth transistor M4 and a fifth transistor M5. The fourth transistor M4 has a source coupled to a drain of the first transistor M1. The fifth transistor M5 has a source coupled to a drain of the second transistor M2, where a gate of the fourth transistor M4 is coupled to a drain of the fifth transistor M5, and where a gate of the fifth transistor M5 is coupled to a drain of the fourth transistor M4.

In aspects, the second cross-coupled circuit 212 may include a sixth transistor M6 and a seventh transistor M7. The sixth transistor M6 has a drain coupled to the drain of the fourth transistor M4 and a source coupled to the reference potential node (Gnd). The seventh transistor M7 has a drain coupled to the drain of the fifth transistor M5, a source coupled to the reference potential node Gnd, and a gate coupled to the drain of the sixth transistor M6. A gate of the sixth transistor M6 is coupled to the drain of the seventh transistor M7. The drains of the fifth and seventh transistors M5, M7 are coupled to one of the differential outputs 206B of the latching circuit 202. The drains of the fourth and sixth transistors M4, M6 are coupled to another one of the differential outputs 206A of the latching circuit 202. In aspects, the fourth and fifth transistors M4, M5 are PMOS transistors, and the sixth and seventh transistors M6, M7 are n-type metal-oxide-semiconductor (NMOS) transistors.

The latching circuit 202 may further include a plurality of pre-charge switches (e.g., implemented by transistors M8, M9, M10, M11). In aspects, the plurality of pre-charge switches may include an eighth transistor M8 and a ninth transistor M9. The eighth transistor M8 has a gate coupled to the clock signal node clkb, a source coupled to the reference potential node (Gnd), and a drain coupled to the gates of the fourth and sixth transistors M4, M6. The ninth transistor M9 has a gate coupled to the clock signal node clkb, a source coupled to the reference potential node (Gnd), and a drain coupled to the gates of the fifth and seventh transistors M5, M7. In certain aspects, the plurality of pre-charge switches may further include a tenth transistor M10 and an eleventh transistor M11. The tenth transistor M10 has a gate coupled to the clock signal node clkb, a source coupled to the reference potential node (Gnd), and a drain coupled to the source of the fourth transistor M4. The eleventh transistor M11 has a gate coupled to the clock signal node clkb, a source coupled to the reference potential node (Gnd), and a drain coupled to the source of the fifth transistor M5. In aspects, the eighth, ninth, tenth, and eleventh transistors M8, M9, M10, M11 are NMOS transistors.

As the pre-charge switches (M8, M9, M10, M11) include a different type of transistor (e.g., NMOS) compared to the transistors (e.g., PMOS) of the clocked input circuit 208, the pre-charge switches are able to discharge (or pre-charge) the cross-coupled circuit(s) (210, 212) at certain nodes (e.g., the source of the fourth transistor M4, the source of the fifth transistor M5, the drain of the sixth transistor M6, and/or the drain of the seventh transistor M7) to the voltage of the reference potential node (Gnd).

In aspects, the sampling circuit 200 may further include a set-reset latch 220 (SR latch) having differential inputs 222A, 222B coupled to respective differential outputs 216A, 216B of the latching circuit 202. The SR latch 220 may buffer the state of the sampling circuit 200 for further processing, such as passing the state to the deserializer 116. In aspects, the SR latch 220 may include cross-coupled NOR logic gates 224, 226.

While the examples provided herein are described with respect to the transistors having a certain type (e.g., NMOS or PMOS), aspects of the present disclosure may also be applied to complementary transistor architectures. For example, the transistors of the clocked input circuit may be NMOS transistors, while the pass-gate transistors may be PMOS transistors, and likewise for the pre-charge switches and cross-coupled circuits.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A differential sampling circuit for a serializer/deserializer (SerDes) receiver, comprising:
    a latching circuit having differential inputs, differential outputs, a clocked input circuit coupled to the differential inputs, a first cross-coupled circuit coupled to the clocked input circuit, and a second cross-coupled circuit coupled to the first cross-coupled circuit, wherein the first and second cross-coupled circuits are coupled to the differential outputs of the latching circuit;
    a plurality of pass-gate transistors, each pass-gate transistor coupled between one of the differential inputs of the latching circuit and a corresponding differential input of the sampling circuit;
    a voltage rail configured to supply current to the sampling circuit; and
    a plurality of capacitive elements, each capacitive element coupled between the voltage rail and a node coupled to the one of the differential inputs of the latching circuit and to a corresponding pass-gate transistor.

2. The sampling circuit of claim 1, wherein each capacitive element is coupled directly to the voltage rail.

3. The sampling circuit of claim 1, wherein at least one of the plurality of capacitive elements comprises a transistor having a gate coupled to one of the differential inputs of the latching circuit, a drain, and a source coupled to the drain and to the voltage rail.

4. The sampling circuit of claim 3, wherein the transistor comprises a p-type metal-oxide-semiconductor (PMOS) transistor.

5. The sampling circuit of claim 1, wherein the latching circuit comprises a StrongARM latch.

6. The sampling circuit of claim 1, wherein at least one of the plurality of pass-gate transistors comprises a n-type metal-oxide-semiconductor (NMOS) transistor having a source coupled to one of the differential inputs of the latching circuit and a drain coupled to the corresponding differential input of the sampling circuit.

7. The sampling circuit of claim 1, further comprising a clock signal node, wherein the clocked input circuit comprises:
    a first transistor having a gate coupled to a first input of the latching circuit;
    a second transistor having a gate coupled to a second input of the latching circuit, wherein the first and second inputs are the differential inputs of the latching circuit; and
    a third transistor having a source coupled to the voltage rail, a drain coupled to sources of the first and second transistors, and a gate coupled to the clock signal node.

8. The sampling circuit of claim 7, wherein the first, second, and third transistors are p-type metal-oxide-semiconductor (PMOS) transistors.

9. The sampling circuit of claim 7, further comprising a reference potential node, wherein:
    the first cross-coupled circuit comprises:
        a fourth transistor having a source coupled to a drain of the first transistor; and
        a fifth transistor having a source coupled to a drain of the second transistor, wherein a gate of the fourth transistor is coupled to a drain of the fifth transistor and wherein a gate of the fifth transistor is coupled to a drain of the fourth transistor; and
    the second cross-coupled circuit comprises:
        a sixth transistor having a drain coupled to the drain of the fourth transistor and a source coupled to the reference potential node; and
        a seventh transistor having a drain coupled to the drain of the fifth transistor, a source coupled to the reference potential node, and a gate coupled to the drain of the sixth transistor, wherein:
            a gate of the sixth transistor is coupled to the drain of the seventh transistor;
            the drains of the fifth and seventh transistors are coupled to one of the differential outputs of the latching circuit; and
            the drains of the fourth and sixth transistors are coupled to another one of the differential outputs of the latching circuit.

10. The sampling circuit of claim 9, wherein the fourth and fifth transistors are p-type metal-oxide-semiconductor (PMOS) transistors and wherein the sixth and seventh transistors are n-type metal-oxide-semiconductor (NMOS) transistors.

11. The sampling circuit of claim 9, wherein the latching circuit further comprises a plurality of pre-charge switches, the plurality of pre-charge switches comprising:
    an eighth transistor having a gate coupled to the clock signal node, a source coupled to the reference potential node, and a drain coupled to the gates of the fourth and sixth transistors; and
    a ninth transistor having a gate coupled to the clock signal node, a source coupled to the reference potential node, and a drain coupled to the gates of the fifth and seventh transistors.

12. The sampling circuit of claim 11, wherein the plurality of pre-charge switches further comprises:
    a tenth transistor having a gate coupled to the clock signal node, a source coupled to the reference potential node, and a drain coupled to the source of the fourth transistor; and
    an eleventh transistor having a gate coupled to the clock signal node, a source coupled to the reference potential node, and a drain coupled to the source of the fifth transistor.

13. The sampling circuit of claim 12, wherein the eighth, ninth, tenth, and eleventh transistors are n-type metal-oxide-semiconductor (NMOS) transistors.

14. The sampling circuit of claim 1, wherein the sampling circuit is a low-voltage differential signaling (LVDS) sampling circuit.

15. The sampling circuit of claim 1, further comprising a set-reset latch having differential inputs coupled to the differential outputs of the latching circuit.

16. The sampling circuit of claim 15, wherein the set-reset latch comprises cross-coupled NOR logic gates.

17. A serializer/deserializer (SerDes) receiver comprising the sampling circuit of claim 1.

\* \* \* \* \*